(12) United States Patent
Takeuchi et al.

(10) Patent No.: US 9,368,675 B2
(45) Date of Patent: Jun. 14, 2016

(54) METHOD OF MANUFACTURING LIGHT-EMITTING DEVICE AND WIRING SUBSTRATE FOR LIGHT-EMITTING ELEMENT

(71) Applicant: NICHIA CORPORATION, Anan-shi (JP)

(72) Inventors: Yoshikazu Takeuchi, Komatsushima (JP); Toshiaki Moriwaki, Itano-gun (JP); Atsushi Takeichi, Anan (JP); Takahiro Tani, Myouzai-gun (JP)

(73) Assignee: NICHIA CORPORATION, Anan-shi (JP)

( * ) Notice: Subject to any disclaimer, the term of this patent is extended or adjusted under 35 U.S.C. 154(b) by 0 days.

(21) Appl. No.: 14/633,133

(22) Filed: Feb. 27, 2015

(65) Prior Publication Data
US 2015/0249191 A1  Sep. 3, 2015

(30) Foreign Application Priority Data
Feb. 28, 2014 (JP) ................ 2014-038706

(51) Int. Cl.
*H01L 21/00* (2006.01)
*H01L 33/00* (2010.01)
*H01L 33/62* (2010.01)
*H01L 23/00* (2006.01)

(52) U.S. Cl.
CPC ............ *H01L 33/0095* (2013.01); *H01L 24/16* (2013.01); *H01L 24/83* (2013.01); *H01L 24/29* (2013.01); *H01L 24/48* (2013.01); *H01L 24/49* (2013.01); *H01L 24/73* (2013.01); *H01L 33/62* (2013.01); *H01L 2224/16245* (2013.01); *H01L 2224/29111* (2013.01); *H01L 2224/29113* (2013.01); *H01L 2224/29144* (2013.01); *H01L 2224/32245* (2013.01); *H01L 2224/48137* (2013.01); *H01L 2224/48247* (2013.01); *H01L 2224/48257* (2013.01); *H01L 2224/48465* (2013.01); *H01L 2224/49113* (2013.01); *H01L 2224/73265* (2013.01); *H01L 2224/83011* (2013.01); *H01L 2224/83192* (2013.01); *H01L 2224/83194* (2013.01); *H01L 2224/83801* (2013.01); *H01L 2224/92247* (2013.01); *H01L 2924/00014* (2013.01); *H01L 2924/1033* (2013.01); *H01L 2924/12041* (2013.01); *H01L 2924/181* (2013.01); *H01L 2933/0066* (2013.01)

(58) Field of Classification Search
None
See application file for complete search history.

(56) References Cited

U.S. PATENT DOCUMENTS

| | | | |
|---|---|---|---|
| 2010/0123163 A1* | 5/2010 | Ohtorii | ............. H01L 23/49838 257/99 |
| 2010/0252855 A1 | 10/2010 | Kamei | |
| 2010/0295078 A1* | 11/2010 | Chen | ...................... H01L 33/50 257/98 |

FOREIGN PATENT DOCUMENTS

| | | |
|---|---|---|
| JP | 5-267359 | 10/1993 |
| JP | 2000-244101 | 9/2000 |
| JP | 2002-223065 | 8/2002 |
| JP | 2000-80141 | 3/2006 |

(Continued)

*Primary Examiner* — Sonya D McCall Shepard
(74) *Attorney, Agent, or Firm* — Mori & Ward, LLP

(57) ABSTRACT

A method of manufacturing a light-emitting device includes flattening top portions of solder bumps disposed on a wiring substrate, disposing a light-emitting element on the solder bumps whose top portions are flattened, and heating the solder bumps to be melt and to be fused so as to provide an adhesive with which the light-emitting element is secured on the wiring substrate.

13 Claims, 9 Drawing Sheets

(56) References Cited

FOREIGN PATENT DOCUMENTS

| | | |
|---|---|---|
| JP | 2007-200947 | 8/2007 |
| JP | 2008-205446 | 9/2008 |
| JP | 2011-9429 | 1/2011 |
| JP | 2012-52059 | 3/2012 |
| WO | WO 2009/063638 | 5/2009 |

\* cited by examiner

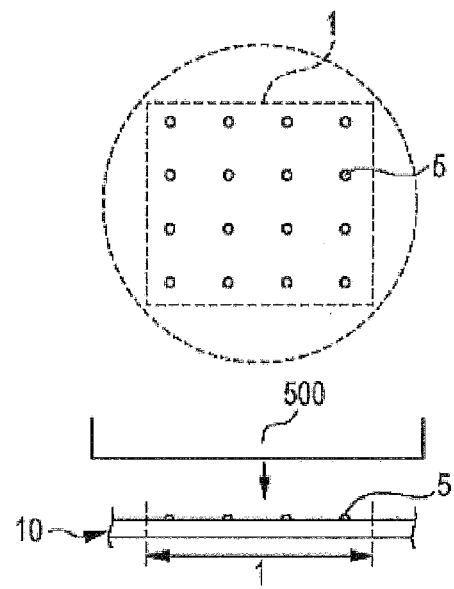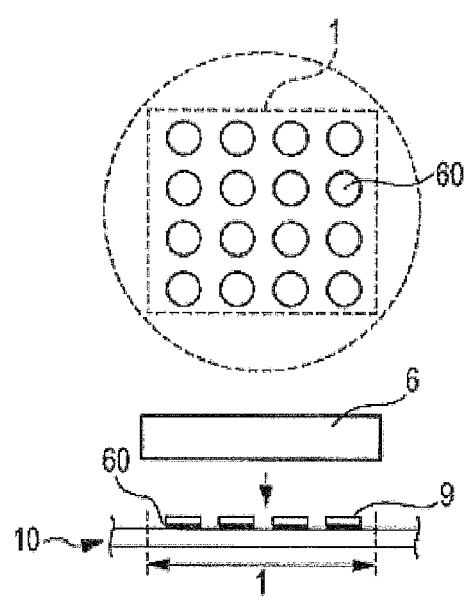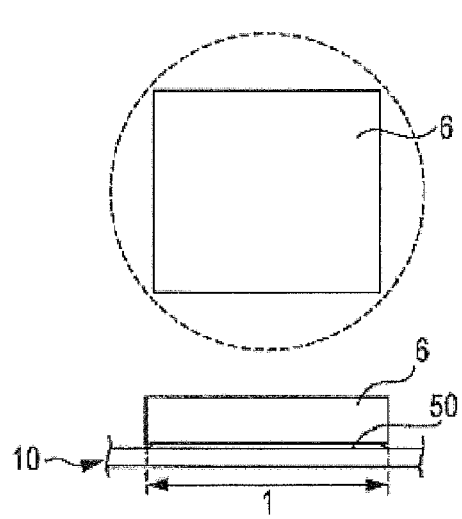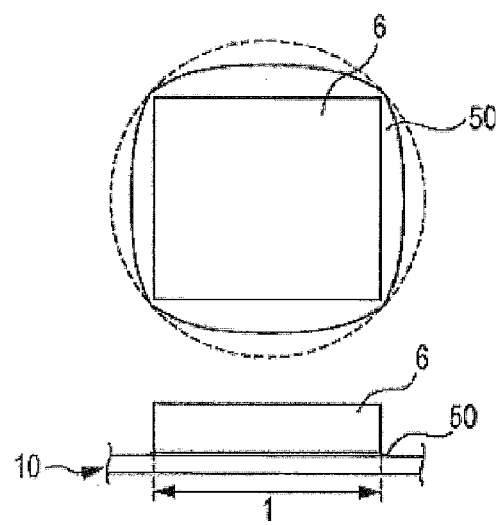

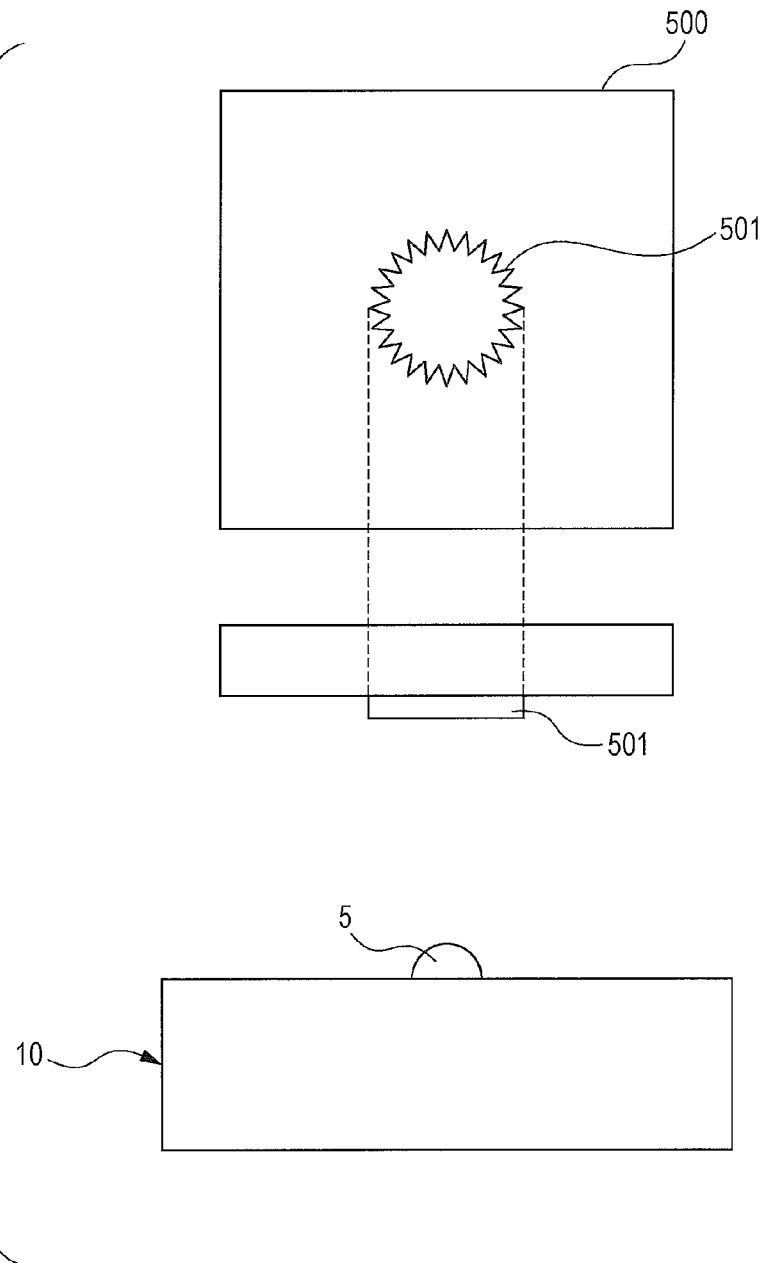

METHOD OF MANUFACTURING LIGHT-EMITTING DEVICE AND WIRING SUBSTRATE FOR LIGHT-EMITTING ELEMENT

CROSS-REFERENCE TO RELATED APPLICATIONS

The present application claims priority under 35 U. S. C. §119 to Japanese Patent Application No. 2014-038706, filed Feb. 28, 2014. The contents of this application are incorporated herein by reference in their entirety.

BACKGROUND

1. Technical Field

The present invention relates to a method of manufacturing a light-emitting device and a wiring substrate for a light-emitting element.

2. Discussion of the Background

As a method for manufacturing a wiring substrate with electronic components such as an IC chip, for example, as described in Japanese Unexamined Patent Application Publication No. 2008-205446, there is a method of providing an integrated solder in a region to which a connection terminal of the electronic component is joined on a wiring substrate, flattening and roughening a top portion of a solder bump to supply flux, disposing a connection terminal of an IC chip on the solder bump, and performing heating and melting.

In addition, in a light-emitting device disclosed in Japanese Unexamined Patent Application Publication No. 2006-80141, one or a plurality of protruding mounting portions having the same height are formed in a lead frame which is a mounting portion of a light-emitting element, and the mounting portion and the light-emitting element are bonded by adhesive such as a solder.

SUMMARY

According to one aspect of the present invention, in a method of manufacturing a light-emitting device, top portions of solder bumps disposed on a wiring substrate are flattened. A light-emitting element is disposed on the solder bumps whose top portions are flattened. The solder bumps are heated to be melt and to be fused so as to provide an adhesive with which the light-emitting element is secured on the wiring substrate.

According to another aspect of the present invention, a wiring substrate for a light-emitting element includes a solder bump. The solder bump has a protruding portion on a side surface of the solder bump. The light-emitting element is to be mounted on the wiring substrate via the solder bump.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings.

FIGS. 2A to 2D are schematic diagrams which describe a first process, a second process, and a third process in the method of manufacturing a light-emitting device according to Embodiment 1. In a circle represented by a dashed line, there is a partially enlarged view of a vicinity of a mounting region.

FIG. 6 is a schematic diagram of a flattening jig for forming a protruding portion on a side surface of the solder bump in the method of manufacturing a light-emitting device according to Embodiment 2.

In FIG. 8A, as to a frame, only an outline of the frame is illustrated so that a wiring is visible.

DESCRIPTION OF THE EMBODIMENTS

Figure 1A:
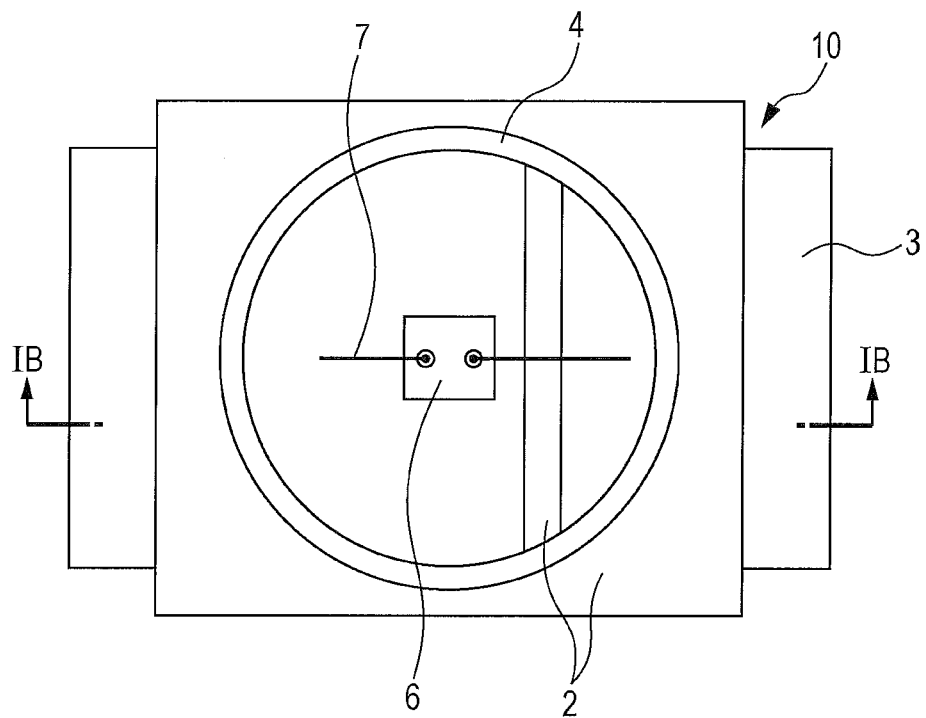
FIG. 1A is a plan view which illustrates a configuration of a light-emitting device manufactured by a method of manufacturing a light-emitting device according to Embodiment 1.

The embodiments will now be described with reference to the accompanying drawings. However, the embodiments are not specifically limited to a method of manufacturing a light-emitting device described below; a dimension, a material, a shape, a relative position, and the like of components are merely examples if there is no specific description; and a size, a positional relationship, or the like of members illustrated in each drawing may be exaggerated in order to clarify the description for some cases. Furthermore, the same designation and numeral represent the same or similar member in general, and detailed description thereof will be appropriately omitted. Each element and embodiment configuring the present disclosure can be, for example, appropriately combined, modified, or changed to be applied unless there is a particular description of exclusion.

Embodiment 1

In a manufacturing method of Embodiment 1, a plurality of solder bumps are disposed at a predetermined position (specifically, a mounting region of a light-emitting element) on a wiring substrate in a first process. Subsequently, top portions of these solder bumps are flattened to obtain a wiring substrate for mounting a light-emitting element. In Embodiment 1, all of the top portions of the solder bumps are flattened so as to have substantially the same height. Here, the wiring substrate for mounting a light-emitting element is a wiring substrate having a plurality of solder bumps formed in a mounting region for a light-emitting element on the wiring substrate, and top portions of these solder bumps are flattened. Therefore, in the embodiments, "the wiring substrate for mounting a light-emitting element" is used to particularly indicate a wiring substrate before a light-emitting element is mounted thereon.

Then, flux is supplied to the top portions of the plurality of solder bumps which are flattened in the first process. Thereafter, a light-emitting element is disposed on the plurality of solder bumps in a second process and the plurality of solder bumps are heated and melted in a third process, and thereby the light-emitting element and the wiring substrate are bonded to each other.

During the third process, at least some of the plurality of solder bumps are fused. The fused solder is used as an adhesive which bonds the light-emitting element and the wiring substrate. In Embodiment 1, the plurality of solder bumps formed in the mounting region are fused together to be an adhesive, and the adhesive (fused solder) has a substantially uniform height.

As described above, after the light-emitting element is disposed on the plurality of solder bumps, at least a portion of the plurality of solder bumps is heated and melted so as to be fused and be an adhesive, and thereby it is possible to reliably bond the light-emitting element and the wiring substrate with a small amount of solder. That is, compared to a case of disposing solder entirely on a region corresponding to a mounting region of the light-emitting element in advance, it is possible to mount the light-emitting element onto the wiring substrate using a small amount of solder because a plurality of bumps smaller than the mounting region are provided, and these bumps are finally fused to bond the light-emitting element and the wiring substrate. In addition, since it is easy to adjust an amount or a formation area of solder to be disposed, a material cost of the solder can be reduced, and furthermore, it is possible to manufacture a light-emitting device in which absorption of light emitted from the light-emitting element is suppressed.

Moreover, the plurality of solder bumps are flattened, and then are heated and melted to be an integrated adhesive (that is, an integrated adhesive is gradually made through two steps), and thereby a plurality of solder bumps are reliably fused, and furthermore a light-emitting element is likely to be stably mounted.

Hereinafter, each element and a manufacturing method of a light-emitting device 100 of Embodiment 1 will be described in detail using FIGS. 1A to 2D.

Wiring Substrate

First, a wiring substrate 10 is prepared. As the wiring substrate 10, a wiring substrate which is obtained by providing wiring 3 to be connected to a light-emitting element and a terminal member for external connection in various types of supporting base material 2 such as ceramic, glass epoxy, glass, metal, and resin can be used. The supporting base material may be removed after disposing the solder bump. The wiring substrate 10 may include a side wall 4 surrounding a light-emitting element 6 or may be in a flat plate shape. When the wiring substrate 10 is set to have the side wall 4, it is possible to improve extraction of light from the light-emitting element 6. When the wiring substrate 10 is set to be in a flat plate shape, it is easy to form the solder bump or to mount the light-emitting element.

It is preferable that the wiring substrate 10 be held as a collective substrate in the first to third processes, since manufacturing is efficiently performed in each process in such case.

For example, it is possible to collectively perform a supply of a solder bump and flux to be described later, a disposition of a light-emitting element, a flattening of a top portion of the solder bump, heating and melting of the solder bump, and the like.

The wiring substrate 10, particularly a mounting region 1 for a light-emitting element on the wiring substrate, is not limited as long as it is formed of a material which can mount thereon a light-emitting element using a solder bump, but is preferably formed of a material which has a high heat resistance and good wettability with solder. Moreover, it is preferable that the wiring substrate 10 be formed of a material which has a low transmittance, since emitted light from the light-emitting element is unlikely to be leaked out below the wiring substrate 10 in such case. Furthermore, since the solder is melted in the manufacturing method of the embodiment, it is preferable that the supporting base material 2 and the wiring 3 be formed of a material which has a small difference in thermal expansion coefficient, since peeling or damage due to a thermal load is unlikely to occur in such case. As a most preferred form of the wiring substrate 10, the wiring substrate 10 having the wiring 3 and a ceramic which is the supporting base material 2 is exemplified in consideration of deformation due to thermal stress. In addition, a wiring substrate configured to have a lead frame (and a wiring substrate configured to have the lead frame and a small amount of resin which has a high heat-resistance) can be preferably used.

In order to be distinguished from "the wiring substrate for mounting a light-emitting element" described below, the wiring substrate mainly indicates a substrate which is in a state before the flattened solder bump is formed on an upper surface thereof, or in a state after the light-emitting element is mounted. However, the wiring substrate for mounting a light-emitting element is referred to as the wiring substrate in a broad sense in some cases in the present specification.

Supporting Base Material

A material of the supporting base material 2 may have electrical insulation, and even when the material has conductivity, the material can be used by being electrically insulated from the wiring 3 by interposing an insulation film or the like therebetween. In particular, as ceramic-based materials, aluminum oxide, aluminum nitride, zirconium oxide, zirconium nitride, titanium oxide, titanium nitride, an LTCC which includes a mixture of these materials, or the like can be used. As a metal, copper, iron, nickel, chromium, aluminum, silver, gold, titanium, an alloy of these, or the like is exemplified. In particular, in the manufacturing method of the embodiment in which the solder is used as an adhesive, since a high thermal load is applied on the wiring substrate 10 in a manufacturing process of the light-emitting device, it is preferable to use a material which has a high heat-resistance and little thermal expansion like the ceramic-based material.

As a resin, thermoplastic resins such as an aliphatic polyamide resin, an aromatic polyamide resin, a semi-aromatic polyamide resin, polyethylene terephthalate, polycyclohexane terephthalate, liquid crystal polymer, a polycarbonate resin, syndiotactic polystyrene, polyphenylene ether, polyphenylene sulfide, a polyether sulfone resin, a polyether ketone resin, and a polyarylate resin, and thermosetting resins such as a poly bismaleimide triazine resin, an epoxy resin, an epoxy-modified resin, a silicone resin, a silicone-modified resin, a polyimide resin, and a polyurethane resin are exemplified. In addition, in these resins, as a filler or a coloring dye, particles or fibers of glass, silica, titanium oxide, magnesium oxide, magnesium carbonate, magnesium hydroxide, calcium carbonate, calcium hydroxide, calcium silicate, magnesium silicate, wollastonite, mica, zinc oxide, barium titanate, potassium titanate, aluminum borate, aluminum oxide, zinc oxide, silicon carbide, antimony oxide, zinc stannate, zinc borate, iron oxide, chromium oxide, manganese oxide, carbon black, or the like can be mixed. As a molding method of the resin, an insert molding, an injection molding, an extrusion molding, a transfer molding, or the like can be used.

As a supporting base material to be removed from the wiring, other than a metal plate which has conductivity such as a stainless steel plate, it is possible to use an electrically-insulating plate formed of polyimide or the like, and to form the wiring by a sputtering method or a vapor deposition method. Alternatively, an electrically-insulating plate-shaped member to which a metal thin film or the like can be pasted may be used. Moreover, since the supporting base material needs to be peeled off from the wiring, it is necessary to use a bendable member, and it is preferable to use a plate-shaped member whose film thickness is about 10 μm to 300 μm depending on the material. As a material of the supporting base material 2, other than the stainless steel described above, a metal sheet of iron; copper, silver, cobalt, nickel or the like, or a resin sheet or the like to which a metal thin film or the like can be pasted and which is made of polyimide are exemplified.

Wiring

It is possible to use, for the wiring 3, a metal which is conductive when being connected to the light-emitting element 6. Specifically, the wiring 3 is formed by copper, nickel, palladium, tungsten, chromium, titanium, aluminum, silver, gold, iron, an alloy of these, or the like. The wiring 3 may be provided in the supporting base material 2, or may be set to be a lead electrode by a lead frame. The wiring 3 is provided at least on an upper surface of the wiring substrate 10, and may be provided on a lower surface (rear surface), a side surface, and inside the supporting base material 2. In particular, a surface of the wiring 3 exposed to an upper surface of the wiring substrate may be provided with light reflection film of silver, aluminum, rhodium, gold, copper, an alloy of these, or the like, and is preferably coated with silver of high light reflectivity. These coatings can be formed by plating, deposition, sputtering, printing, a coating method, or the like.

The wiring 3 formed by plating or the like on the supporting base material preferably has a thickness of about 1 μm to 50 μm, and any wiring pattern can be appropriately selected. Such wiring 3 is preferably used because the wiring 3 has less thermal expansion than a lead frame (lead electrode) to be described later, and is unlikely to be peeled off due to heat applied at the time of a disposition or a melting of the solder.

The lead frame (lead electrode) is preferably formed of a material which has high heat radiation and a relatively high mechanical strength. Furthermore, it is preferable that the lead frame be configured from a material which is suitable for punching press processing or etching processing. A thickness, a shape, or the like of the lead frame can be appropriately adjusted in consideration of a size, a shape, or the like of a desired light-emitting device.

Figure 1B:
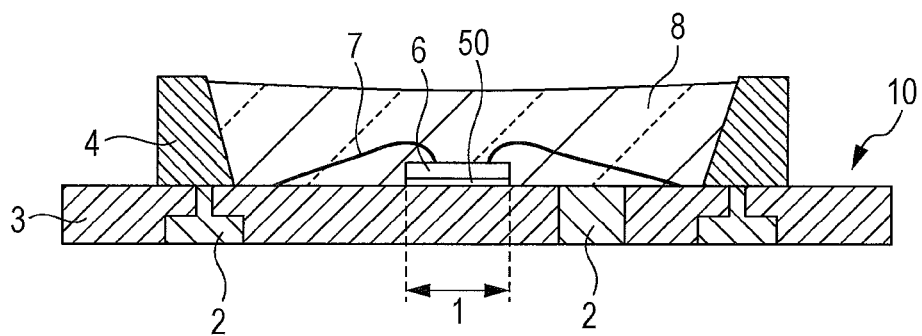
FIG. 1B is a cross-sectional view of the light-emitting device taken along line IB-IB shown in FIG. 1A.

The wiring substrate 10 of Embodiment 1 is configured to have the lead frame and the resin as illustrated in FIGS. 1A and 1B, and a pair of positive and negative lead electrodes which is the wiring 3, and the light-emitting element 6 are electrically connected to each other.

As described above, a wiring substrate including at least wiring is described; however, the wiring substrate is not limited to have conductivity as long as the light-emitting element can be mounted in a mounting region of the wiring substrate.

Mounting Region

A mounting region 1 of the light-emitting element is a portion of an upper surface of the wiring substrate 10 as described above. In particular, in the case where an insulation substrate side of the light-emitting element 6 are mounted on an upper surface of the wiring 3 with a solder bump (face-up mounting), the mounting region 1 is a region substantially corresponding to a mounting surface of the light-emitting element 6 in the upper surface of the wiring substrate 10 as illustrated in FIGS. 2A to 2D. The plurality of solder bumps 5 are disposed in the mounting region 1. It is preferable that the plurality of solder bumps 5 be disposed to be comparatively close to each other in the mounting region 1, since an occurrence of voids can be preferably suppressed, but the plurality of solder bumps 5 can be formed at any appropriate intervals. When the wiring substrate has wiring and a mounting region is present on the wiring, it is possible to more reliably electrically connect the light-emitting element 6 and the wiring substrate 10.

Light-Emitting Element

The light-emitting element 6 to be mounted on the wiring substrate 10 is configured to have at least a first conductivity type (n-type) layer and a second conductivity type (p-type) layer, and preferably has a semiconductor stacked structure which has an active layer therebetween. Moreover, the light-emitting element 6 has a structure able to be mounted on the wiring substrate by the solder. For example, it is preferable that a metal film be formed on a mounting surface side of the light-emitting element, since adhesion to the solder is improved. As a material of the metal film, it is possible to use silver or the like which have high light reflectivity. Regarding the electrode, it is possible to selectively adopt a same surface-side electrode structure or a counter electrode structure. In the same surface-side electrode structure, bipolar electrodes are provided on an upper surface of a semiconductor stacked structure on an insulation substrate. In the counter electrode structure, electrodes of each polarity are respectively provided on upper and lower surfaces of a semiconductor stacked structure on a conductive supporting base material, in the stacked direction of the semiconductor stacked structure. In the same surface-side electrode structure, the insulation substrate side of the light-emitting element 6 and the wiring substrate 10 may be connected (face-up mounting). Alternatively, flip-chip mounting in which an electrode formation surface of the light-emitting element 6 is connected to the wiring substrate 10, and an insulation substrate side facing the electrode formation surface is set to be a main light emitting surface can be performed. The electrically-insulating substrate may be removed, and furthermore a structure in which another substrate, for example, is bonded to the semiconductor stacked structure from which the electrically-insulating substrate is removed can be used. Removal of the substrate can be performed by mounting or holding the substrate on a support body, a device, a sub-mount, or the like and performing peeling, grinding, or laser lift off (LLO).

The light-emitting element 6 is designed to output light of an arbitrary wavelength, and is preferably a semiconductor light-emitting element.

In particular, when a GaN-based compound semiconductor is used in a light-emitting element structure, visible light or ultraviolet light of a short wavelength that can efficiently excite a phosphor can be emitted. A specific light emission peak wavelength is about 300 nm to 560 nm, and is preferably about 380 nm to 470 nm. ZnSe-based, InGaAs-based, or AlInGaP-based semiconductor light-emitting elements may also be used.

Solder Bump

The plurality of solder bumps 5 are disposed in a mounting region 21 of the light-emitting element on the wiring substrate 10, and heated and melted in the third process so as to bond the light-emitting element 6 and the wiring substrate 10. As a material, tin-based, tin-silver-based, tin-copper-based, tin-silver-copper-based, bismuth-tin-based, gold-tin-based, gold-silicon-based, and gold-germanium-based solders can be used, and each of the materials can be appropriately contained in a desired ratio.

A Method of Manufacturing a Light-Emitting Device

First Process

Each process of manufacturing a light-emitting device 100 will be described using FIGS. 2A to 2D, 3, and 4A to 4C.

Figure 3:
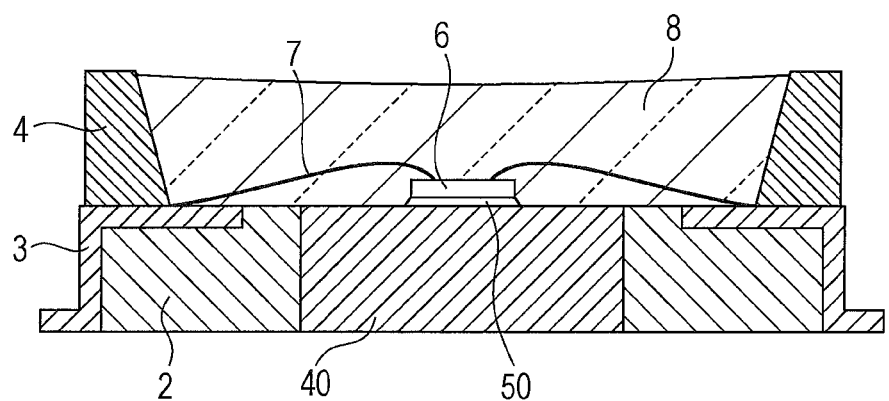
FIG. 3 is a cross-sectional view which illustrates a configuration of the light-emitting device manufactured by the method of manufacturing a light-emitting device according to Embodiment 1.

First, the plurality of solder bumps 5 are disposed in a mounting region 1 for a light-emitting element on the prepared wiring substrate 10. The mounting region 1 for the light-emitting element of Embodiment 1 is a region substantially equal to a mounting surface for the light-emitting element 6 on any one electrode of the pair of positive and negative lead electrodes, and the plurality of solder bumps 5 are disposed therein. The mounting region 1 for the light-emitting element is not limited to being on the lead electrode (wiring), and when the light-emitting element is disposed on a non-polar heat radiation plate 40 as illustrated in FIG. 3, and the light-emitting element and the positive and negative lead electrodes (wiring) are electrically connected by wires or the like, the mounting region 1 for the light-emitting element can be on the heat radiation plate.

Figure 4A:
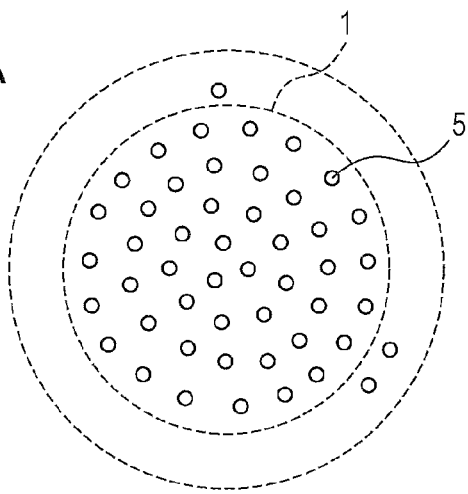
FIGS. 4A to 4C are plan views which illustrate a mounting region of the light-emitting device according to Embodiment 1 and a plurality of solder bumps before flattening, which are disposed in the mounting region.
Figure 4B:
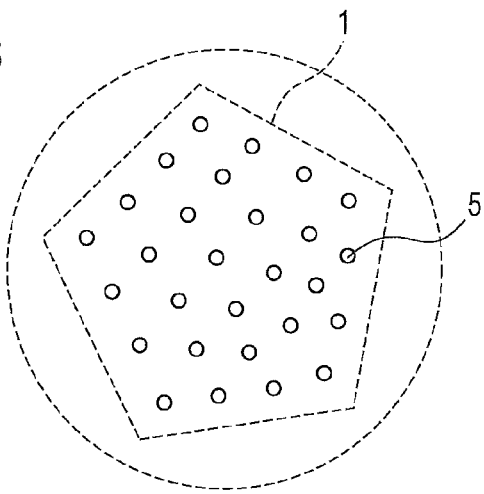
Figure 4C:
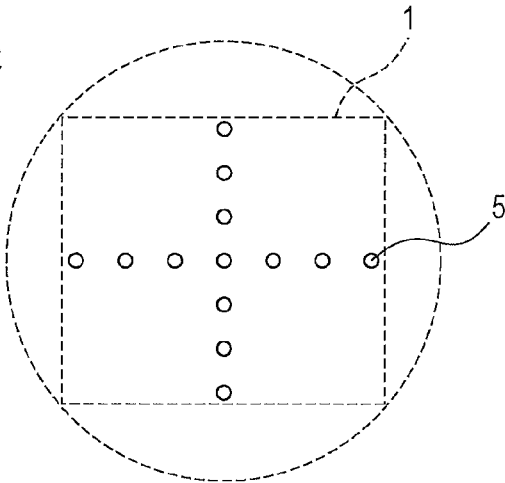

It is preferable that the mounting region 1 have substantially the same shape as the mounting surface of the light-emitting element 6 as described above. For example, as illustrated in FIGS. 4A to 4C, a circular shape, a polygonal shape, or the like can be used in addition to a rectangular shape in accordance with a shape of the mounting surface of the light-emitting element. By doing so, an excessive expansion of adhesive 50 formed in the third process outward from the mounting region 1 in a top view can be suppressed. The mounting region 1 of Embodiment 1 has a substantially rectangular shape of about 1000×1000 μm.

In Embodiment 1, first, as illustrated in FIG. 2A, substantially hemispherical solder bumps 5 are disposed in a lattice form at regular intervals in a substantially rectangular mounting region 1 surrounded by broken lines on the lead electrode. The plurality of solder bumps 5 can be formed by conventional methods such as a method of placing a mask having an opening which allows the solder bumps 5 of a desired diameter to be formed on the wiring substrate, and printing a solder paste using jigs such as squeegees, a method of supplying a solder paste by a jet dispenser and then forming the solder paste in a ball shape by pre-reflow, or the like. In addition, a disposition can be performed by known methods such as a plating method, a vapor deposition method, a stud bump method, and the like. Before disposing the solder bumps, the wiring substrate may be coated with a temporary bonding agent or the like.

A diameter, a height, a solder amount, or a pitch of each of the solder bumps to be disposed is not particularly limited, but it is preferable that the solder bumps are not in contact with each other in the flattening in the first process, that is, each solder bump is disposed with an amount and an interval to be connected at the first time in the third process, so that an amount of solder can be reduced. In Embodiment 1, using the materials described above (for example, gold-tin (Au80/20Sn), tin-silver (Sn96.5/3.5Ag), tin-silver-copper (Sn96.5/3Ag/Cu), tin-copper (Sn99.45/0.55Cu), or the like), 16 (4×4) solder bumps 5 are disposed at intervals of about 250 μm.

Each of the solder bumps 5 has a substantially hemispherical shape with a diameter of about 70 μm to 200 μm, and a thickness of about 60 μm to 150 μm A weight of each solder bump can be set to about 0.05 g to 0.2 g. Any arrangement of the plurality of solder bumps 5 can be appropriately selected, and can be set to a circular shape, for example, or the like as illustrated in FIGS. 4A to 4C in addition to a lattice shape. The solder bumps are preferably formed inside a mounting region to have a shape corresponding to a shape of the mounting region; however, the solder bumps may be disposed outside the mounting region 1 as illustrated in FIG. 4A. The plurality of solder bumps are required to be disposed in the mounting region 1 so as to bond the light-emitting element 6 and the wiring substrate 10 by performing melting in the third process to be described later to fuse at least a portion of the plurality of solder bumps. In addition, the solder bumps 5 may be processed so as to have a desired shape, respectively, as described later in Embodiment 2.

Subsequently, top portions of the plurality of formed solder bumps 5 are flattened. A flattening method is not particularly limited, but flattening can easily be performed by heating or/and pressurization with jig. The flattening is a process that makes the top portions of the plurality of solder bumps 5 substantially flattened; however, in the case where the solder bumps 5 are expanded as compared with those before the flattening in plan view, this is assumed to be a flattened state. In performing the flattening, a flattening device having an electric heater or the like can be used. For example, as illustrated in FIGS. 2A and 2B, the top portions of the plurality of solder bumps 5 formed on a lead electrode can be collectively flattened by vertically pressurizing the plurality of solder bumps 5 with a predetermined pressure (for example, pressurization for about 60 sec with a pressure of about 50 N) from above by a flattening jig 500 which is heated to a predetermined temperature (for example, about 200° C.) using the electric heater and the like. By performing such flattening, adhesion between the solder bump 60 and the wiring substrate 10 is improved.

In Embodiment 1, the solder bumps are flattened with the conditions described above to obtain a wiring substrate for mounting a light-emitting element having the plurality of solder bumps 60, each of which is deformed to have a diameter of about 100 μm to 250 μm and a thickness of about 20 μm to 60 μm with a set interval. In this case, a distance between adjacent solder bumps 60 whose top portions are flattened is about 20 μm to 180 μm.

In order to reliably flatten the top portions of the solder bumps 5, it is possible to press the solder bumps so that, for example, a pressure of about 0.05 N to 0.8 N is applied to each bump. Solder is more likely to be deformed when heating is performed in addition to pressurization, and therefore the solder can be flattened with less pressure than when flattened only by pressurization, and it is possible to reduce a mechanical load on the wiring substrate. In particular, even when warping has occurred in the wiring substrate, it is possible, by pressurization and heating, to flatten the solder bump without causing cracks in the wiring substrate by suppressing a mechanical pressure.

When heights of top portions of bumps are made to be equal at a time of flattening, it is easy to dispose the flux 9 or the light-emitting element 6 in the following process, and furthermore, a wiring substrate for mounting a light-emitting element on which the light-emitting element 6 is stably mounted can be obtained. For example, when flattening is performed such that the diameter of the top portions becomes about 10 μm to 30 μm or more, it is preferable that the flux 9 relatively easily remain at the top portions. Furthermore, when heights of top portions of bumps are made to be equal, the solder bumps are likely to be uniformly fused in the third process. In the embodiment, since the solder bumps are fused in the third process, even if variation occurs in the height of the top portions of the solder bumps 60 after they have been flattened, it is possible to suppress connection failure between the light-emitting element 6 and the wiring substrate 10.

When flattening the plurality of solder bumps 5 in the first process, flattening may be performed such that at least a portion of the plurality of the solder bumps 5 are joined. A form in which the solder bumps are joined to each other when performing flattening will be described in detail in Embodiment 2 to be described later.

Then, a flux 9 is disposed on a top portion of each of the solder bumps 60 flattened in the first process. A method of disposing the flux 9 is not particularly limited, but a method of applying the flux, a spray method of spraying the flux, and the like are exemplified. A type of the flux 9 is not particularly limited, but it is preferable to use a flux with high viscosity, since the flux is unlikely to be dropped off from the top portion of each of the solder bumps 60. However, in this embodiment, since the top portion of each of the solder bumps is substantially flat, it is possible to use a flux 9 with a comparatively low viscosity, and to appropriately select and use a known flux.

Second Process

Subsequently, the light-emitting element 6 is disposed on the plurality of solder bumps 60 on which the flux 9 is disposed. It is preferable that the solder bumps 60 on which the light-emitting element 6 is disposed be inside an outer periphery of the light-emitting element 6 in top view as illustrated in FIG. 2B. In the case where some of the solder bumps 60 are outside the outer periphery of the light-emitting element 6, the solder bumps may not be melted with the solder bumps being inside the outer periphery and not be integrated, but may remain in a ball shape. In this case, it is possible to suppress the solder bumps to remain as a ball shape by coating not only an inside of an outer periphery of the light-emitting element (an inside of a mounting region) but also a region on the wiring substrate on which the solder bumps are formed with gold or silver having good wettability with respect to solder. The light-emitting element 6 of Embodiment 1 has the same-side surface electrode structure in which a semiconductor stacked structure is stacked on an insulation substrate, and an insulation substrate side of the light-emitting element are mounted on an upper surface of the wiring with solder bumps (face-up mounting). Therefore, the light-emitting element 6 is disposed on top portions of the plurality of solder bumps 60 on which the flux 9 is disposed so that the insulation substrate faces the top portions.

Third Process

In the third process, each of the solder bumps 60 is heated and melted (in other words, reflowed) in a state where the light-emitting element 6 is disposed in the second process. By doing so, the flux 9 is vaporized, and the light-emitting element 6 and the wiring substrate 10 are bonded. When the heating and melting is performed, at least some, preferably all, of the plurality of solder bumps are fused, and thereby an adhesive 50 is formed. In Embodiment 1, all of the plurality of solder bumps are fused in an integrated manner as illustrated in FIG. 2C. Forming the adhesive 50 in this manner allows thicknesses of the fused solder bumps 60 likely to be substantially uniform, and thus it is possible to horizontally (stably) connect the light-emitting element 6 to the wiring substrate 10. Furthermore, the adhesive 50 is expanded in the mounting region 1 in an integrated manner, and thereby the adhesive 50 becomes a thinner film (for example, about 20 μm) than a state of the solder bumps, and it is possible to efficiently radiate heat from the light-emitting element. In addition, a plurality of small solder bumps 5 are disposed in the mounting region 1 with a small amount of solder as described above, and are heated and melted to be fused, and thereby it is possible to suppress an occurrence of voids in an adhesive, as compared to the case where solder is disposed in all of the mounting region in advance. That is, the flux 9 vaporized when solder bumps are melted can be effectively released into the air.

In Embodiment 1, all of the solder bumps are fused to be an integrated adhesive 50, but some solder bumps which are not fused may be present, the fused solders may have voids or the like to an extent of not affecting a bonding, and at least a portion of the plurality of solder bumps may be fused by heating and melting.

In Embodiment 1, 16 solder bumps 5 each having a diameter of about 70 μm to 200 μm and a thickness of about 60 μm to 150 μm (about 0.05 g to 0.2 g) disposed in a lattice form at intervals of about 250 μm in the mounting region of about 1000×1000 μm in the first process are finally deformed into the integrated adhesive 50 having a thickness of about 10 μm to 25 μm in a mounting region of about 1000 μm×1000 μm via the third process.

According to the manufacturing method of Embodiment 1, compared to a case of applying an integrated solder entirely to the mounting region 1 in advance, it is possible to reliably bond the light-emitting element and the wiring substrate with a small amount of solder. Furthermore, the adhesive 50 can be disposed inside an outer periphery of the light-emitting element 6 as illustrated in FIG. 2C. By doing so, when compared to the light-emitting device in which the solder bumps 60 are in a state of being expanded outward from the outer periphery of the light-emitting element as illustrated in FIG. 2D, the light-emitting device according to the Embodiment 1 can be set to suppress light absorption by approximately 5%. The above-described "state of being expanded outward" is referred to as, for example, a case where a light-emitting device in which a GaN-based compound semiconductor layer is stacked on a sapphire substrate of about 120 μm, a rear surface side of the sapphire substrate that is the mounting surface is coated with silver, and a mounting region is coated with silver is used; and a solder is disposed in an area of substantial circumscribed circle of the light-emitting element in top view after mounting the light-emitting element.

Subsequently, an electrode of the light-emitting element 6 which is mounted in the third process and the lead electrode are electrically connected by wire bonding. As necessary, the light-emitting element 6 and a wire 7 can be sealed by a light transmitting member 8 which contains a desired wavelength converting member, a light diffusing material and the like. By finally performing dicing, the light-emitting device 100 illustrated in FIG. 1 is completed.

Embodiment 2

Figure 5A:
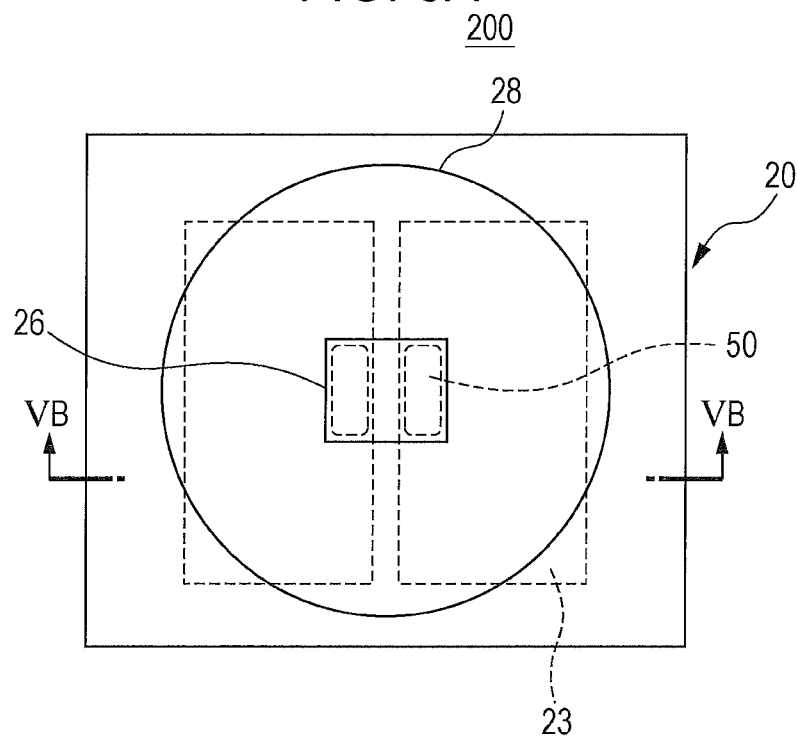
FIG. 5A is a plan view which illustrates a configuration of the light-emitting device manufactured by a method of manufacturing a light-emitting device according to Embodiment 2.
Figure 5B:
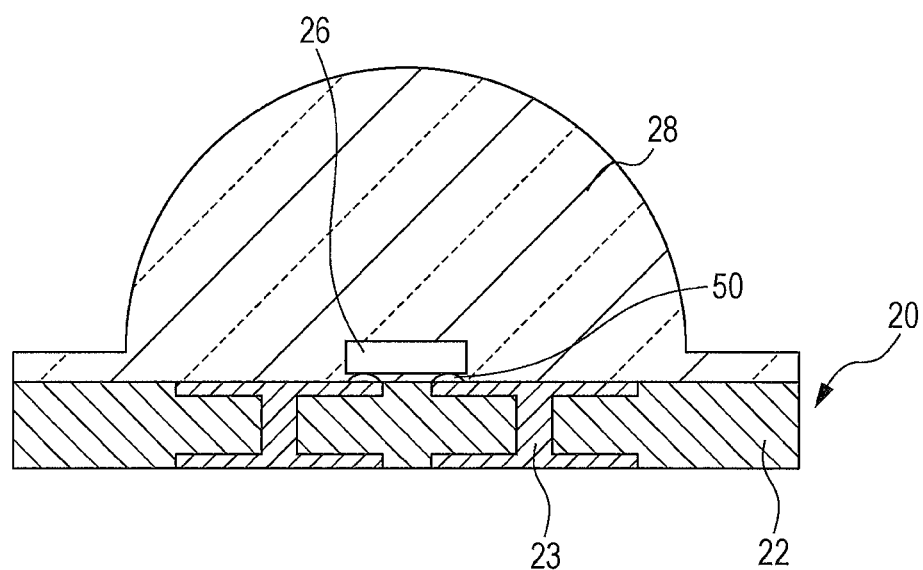
FIG. 5B is a cross-sectional view of the light-emitting device taken along line VB-VB illustrated in FIG. 5A.

In a light-emitting device 200 of Embodiment 2 illustrated in FIGS. 5A and 5B, a light-emitting element 26 of vertically and horizontally about 500 μm in top view is flip-chip mounted onto a wiring substrate 20 in which wiring 23 is provided in a supporting base material 22. For example, it is preferable that the supporting base material 22 of Embodiment 2 be formed of a ceramic, and the wiring 23 be formed of gold. In Embodiment 2, since the light-emitting element 26 (about 500×500 μm) is flip-chip mounted, a mounting region 21 is a region in which a pair of positive and negative electrodes of the light-emitting element 6 is disposed on an upper surface of the wiring substrate 20. In the first process, three solder bumps 5 each having a diameter of about 100 μm to 180 μm and a thickness of about 60 μm to 150 μm (about 0.05 g to 0.2 g), a total of six solder bumps, are formed in the mounting region 21 at intervals of about 120 μm to 200 μm. When the number of the solder bumps 5 is small, bumps can be easily formed.

In addition, a protruding portion 70 is formed on a side surface of each of the plurality of disposed solder bumps 5. Furthermore, a wiring substrate for mounting a light-emitting element in which the plurality of solder bumps are joined by being flattened is obtained. Other than the above, the light-emitting device 200 is manufactured in substantially the same structure and forming method as the light-emitting device 100 of Embodiment 1, such that a description will be appropriately omitted. Hereinafter, points different from the structure and the formation method of the light-emitting device 100 of Embodiment 1 will be mainly described in detail.

The wiring 23 of Embodiment 2 is formed at least on an upper surface of the supporting base material 22. The mounting region 21 of the light-emitting element is on each of the pair of positive and negative wirings 23 which bond each electrode of the light-emitting element 26 as illustrated in FIG. 5A, and the plurality of solder bumps 5 are provided in the mounting region 21 which has substantially the same shape as each electrode of the light-emitting element. In detail, a total of six solder bumps 5, each three in a row, are disposed on a closer side between the positive and negative wirings on each of the positive and negative wirings. In the embodiment, since the light-emitting element 6 is flip-chip mounted, the solder bumps are formed, flattened, and melted so that the solder bumps on the pair of positive and negative wirings 23 are not integrated each other.

The protruding portion 70 can be formed at the same time as deposition of the solder bumps in the first process, at the same time as flattening, or before and after the flattening. It is efficient that the protruding portion 70 is formed at the same time as the disposition or the flattening of the solder bumps; however, the embodiment is not particularly limited thereto. For example, as illustrated in FIG. 6, a protruding portion formation on a side surface and flattening of a top portion can be performed at the same time by pressing the solder bumps 5 in a mold which can form a desired protruding portion 70 after the deposition of the solder bumps. In this case, it is preferable that the flattening jig 500 described above have a mold 501 on a side facing the solder bumps, and the flattening jig 500 can form a desired protruding portion 70 on a side surface of the solder bumps.

For example, it is preferable that the mold 501 be larger than each solder bump 5 in top view. In addition, in the case where there is a mold larger than each solder bump 5 in top view as described above, it is preferable that a depth of the mold 501 be smaller than a height of the solder bumps 5 which are disposed in the mounting region. By using the flattening jig 500 having such a mold 501, it is possible to form the protruding portion 70 on a side surface while reliably flattening top portions of the plurality of solder bumps.

The protruding portion 70 is not necessarily formed on side surfaces of all solder bumps, and solder bumps which do not have the protruding portion 70 may be present. In addition, the protruding portion 70 may not be formed on the entire side surface as long as formed in at least a portion of a side surface of the solder bumps, but it is preferable to be formed on opposite sides of adjacent solder bumps each other. Forming the protruding portion 70 using the mold as described above makes it possible to appropriately and without limitation select a shape or a position of the protruding portion 70 and a solder bump in which the protruding portion is formed. In addition, the protruding portion may be formed by selecting an appropriate method such as a method of printing a solder paste using a mask (mold) which has an opening which allows the protruding portion 70 to be formed on a side surface of the solder bump.

Figure 7A:
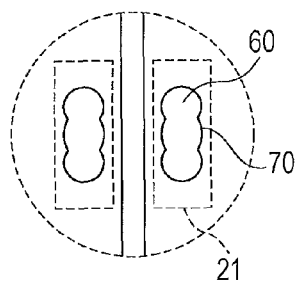
FIGS. 7A to 7C are plan views which illustrate solder bumps joined by flattening of the first process in the method of manufacturing a light-emitting device according to Embodiment 2.
Figure 7B:
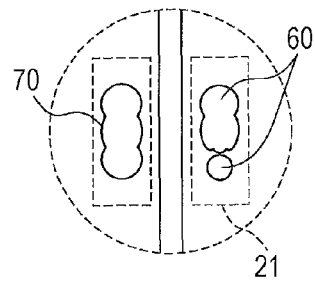

In Embodiment 2, when flattening the top portions of the solder bumps, at least a portion of the plurality of solder bumps are joined. The protruding portion 70 may be formed by such joining. That is, as illustrated in FIG. 7A, the solder bumps 60 joined by flattening, in top view, opposite side surfaces of adjacent solder bumps are joined to be connected, and an outer periphery of the connected solder bumps is formed by a plurality of curves; and it is possible to set a curve surface of the outer periphery to be the protruding portion 70. In detail, the protruding portion formed by the flattening in Embodiment 2 is formed with a relatively gentle arc-shaped curve in top view, compared to the protruding portion formed in the mold 501 as described above. In Embodiment 2, the flattening is performed so that all adjacent side surfaces of three solder bumps can be joined. However, not all adjacent side surfaces have to be joined, and at least a portion of side surfaces of adjacent solder bumps may be joined as in FIG. 7B. The solder bumps 5 can be joined into a desired shape by appropriately adjusting a diameter of the solder bump, a solder amount, pitch, presence or absence of a protruding portion on a side surface, a temperature of a heating, or/and intensity of pressurization.

Figure 7C:
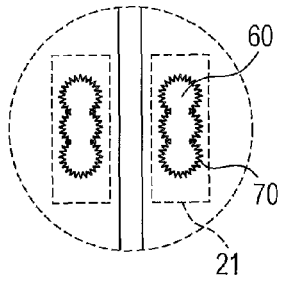
Figure 7D:
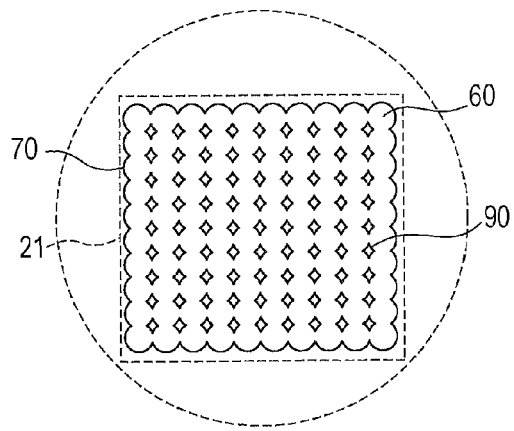
FIG. 7D is a plan view which illustrates the solder bumps joined by the flattening in the first process of Embodiment 1.
Figure 7E:
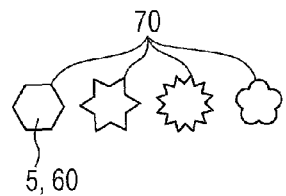
FIG. 7E is a view in which the protruding portion of the solder bump is exemplified.

As described above, it is efficient to form the protruding portion 70 by a joining the solder bumps by the flattening since the protruding portion 70 can be formed at the same time as the flattening, and furthermore, it is not necessary to prepare a mold 500 for forming the protruding portion. A form of the protruding portion 70 is not limited to the above description, and both the protruding portion formed in each solder bump by a mold and the protruding portion formed by the joining may be included as illustrated in FIG. 7C. In addition, as illustrated in FIG. 7E, it is possible to form a protruding portion by processing the solder bump in a desired shape appropriately.

As described above, it is preferable that the protruding portion 70 is formed on the side surface of the solder bump in the first process, since surface tension occurs due to an unevenness on a bump side surface, and thereby the flux 9 is likely to be held on the solder bump, even if a disposition of the flux 9 is displaced from the solder bump top portion, or a supply amount to the top portion is large. Furthermore, it is preferable that the protruding portion 70 is formed on side surfaces facing each other of adjacent solder bumps, since an interval between solder bumps can become short, the solder bumps can be easily joined to each other during the flattening, and the plurality of solder bumps are likely to be fused in an integrated manner in the third process below. Similarly, joining solder bumps by flattening the solder bumps allows an adhesive to be easily integrated in a uniform thickness in the third process, and furthermore, allows the light-emitting element 26 to be stably disposed in the second process. In addition, since an interval (a distance) between the solder bumps from which the flux 9 is dropped off is reduced, it is possible to suppress occurrence of voids.

Here, since plating is performed on the wiring 23 in Embodiment 2, roughness of the surface of the wiring substrate 20 is likely to be relatively large. For example, surface roughness of the mounting region 21 in which the plurality of solder bumps are disposed is Ra of about 3.0 μm or more. In this manner, the top portions of the plurality of solder bumps 5 disposed in a mounting region whose surface roughness is large are flattened, and heights of the top portions are aligned to be substantially the same as each other, and thereby it is possible to stably perform a disposition of the light-emitting element 26 in the second process.

In Embodiment 2, with respect to a wiring substrate for mounting a light-emitting element which includes two solder bumps that are obtained as described above (that is, obtained by flattening top portions of three solder bumps and joining to have, for example, a length of about 130 μm to 220 μm, a width of about 130 μm to 220 μm, a thickness of about 20 μm to 60 μm, and a weight of 0.15 g to 0.6 g, and to have the protruding portion 70 on a side surface) on wiring, an electrode side of the light-emitting element which has the same surface-side electrode structure and the solder bump are disposed to be in contact in the second process. Subsequently, the adhesive 50 which bonds the light-emitting element 26 and the wiring substrate 20 is formed by performing a melting so that a thickness of each solder bump becomes about 15 μm in the third process like in Embodiment 1.

Then, in the same manner as in Embodiment 1, a light transmitting member 28 which covers at least a portion of the light-emitting element and the wiring substrate is formed and diced as necessary to complete a desired light-emitting device 200 (for example, a light-emitting device of length and width of about 3.5 mm). In Embodiment 2, since the light-emitting element 26 is flip-chip mounted, each electrode of the light-emitting element and the wiring substrate are bonded with a small amount of solders, and thereby each solder bump on the pair of positive and negative wirings 23 is unlikely to be integrated. Thus, it is particularly preferred in that a short circuit of the light-emitting device can be prevented.

In Embodiment 2, the protruding portion 70 is formed on side surfaces of the plurality of solder bumps by joining the plurality of solder bumps during the flattening, and the light-emitting element 26 is disposed on a solder bump on which the protruding portion 70 is formed, and thereby the light-emitting element 26 is flip-chip mounted on the wiring substrate 20. However, as illustrated in Embodiment 1, even in the case where the insulation substrate side of the light-emitting element and the wiring substrate are mounted (face-up mounting) with the solder bumps, the protruding portion 70 may be formed in the same manner. FIG. 7D is a schematic diagram which illustrates an example in which the plurality of bumps in Embodiment 1 are joined by the flattening, and a hole 90 and the protruding portion 70 on the side surface are formed. The hole 90 is formed, and thereby the protruding portion of the solder bump is formed in top view, so that flux is likely to be held on the solder bump due to the surface tension. Moreover, the protruding portion 70 may be fused in the third process, or may be held.

Embodiment 3

Figure 8A:
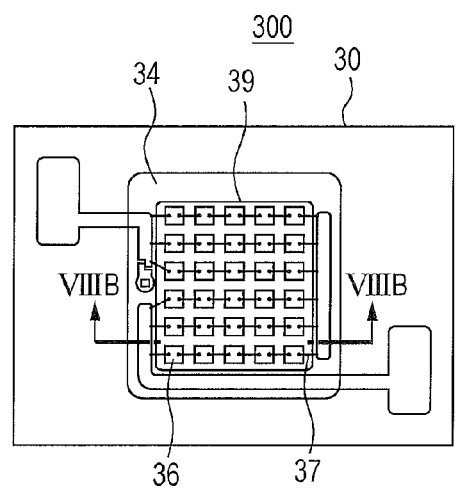
FIG. 8A is a plan view which illustrates a configuration of a light-emitting device manufactured by a method of manufacturing a light-emitting device according to Embodiment 3.
Figure 8B:
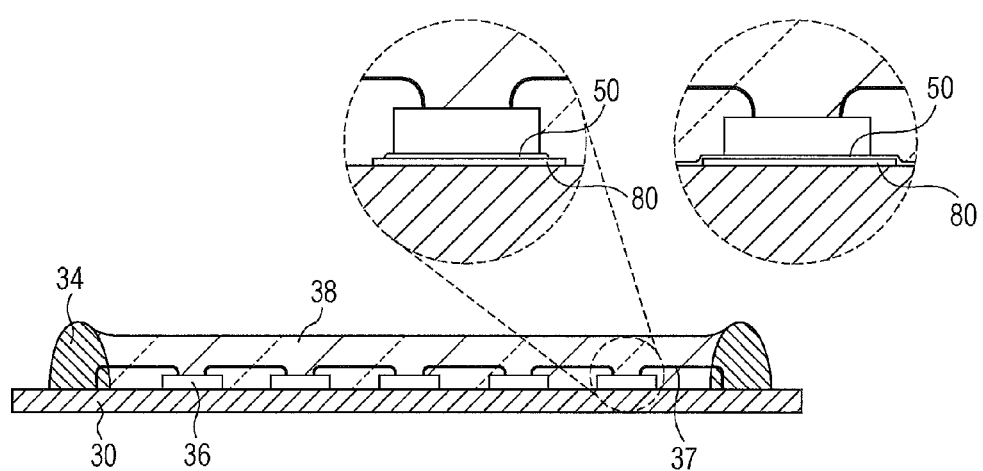
FIG. 8B is a cross-sectional view of the light-emitting device taken along line VIIIB-VIIIB illustrated in FIG. 8A.

A light-emitting device 300 of Embodiment 3 has a chip on board (COB) structure as illustrated in FIG. 8A. In the light-emitting device 300, a plurality of light-emitting elements 36 are mounted on a wiring substrate 30 which has wiring formed by plating on a ceramic supporting base material at a relatively narrow intervals (narrow pitch). As illustrated in a partially enlarged view of FIG. 8B, a coating 80 of Ag or the like may be formed on the wiring substrate 30 as a reflective film. It is preferable to form the coating 80 in a larger area than a mounting surface of the light-emitting element 36, since light emitted from the light-emitting element 36 can be reflected in an effective manner. In the case where the insulation substrate side of the light-emitting element is mounted so as to face the wiring substrate as illustrated, it is possible to form the coating 80 on an entire surface of a bottom surface 39.

A pair of positive and negative pad portions are provided on an outside of the frame 34 as a pair of pad electrodes for applying a driving voltage of the light-emitting element 36 from the outside, and an electrode of the light-emitting element 36 is connected to the pad portions.

Figure 9:
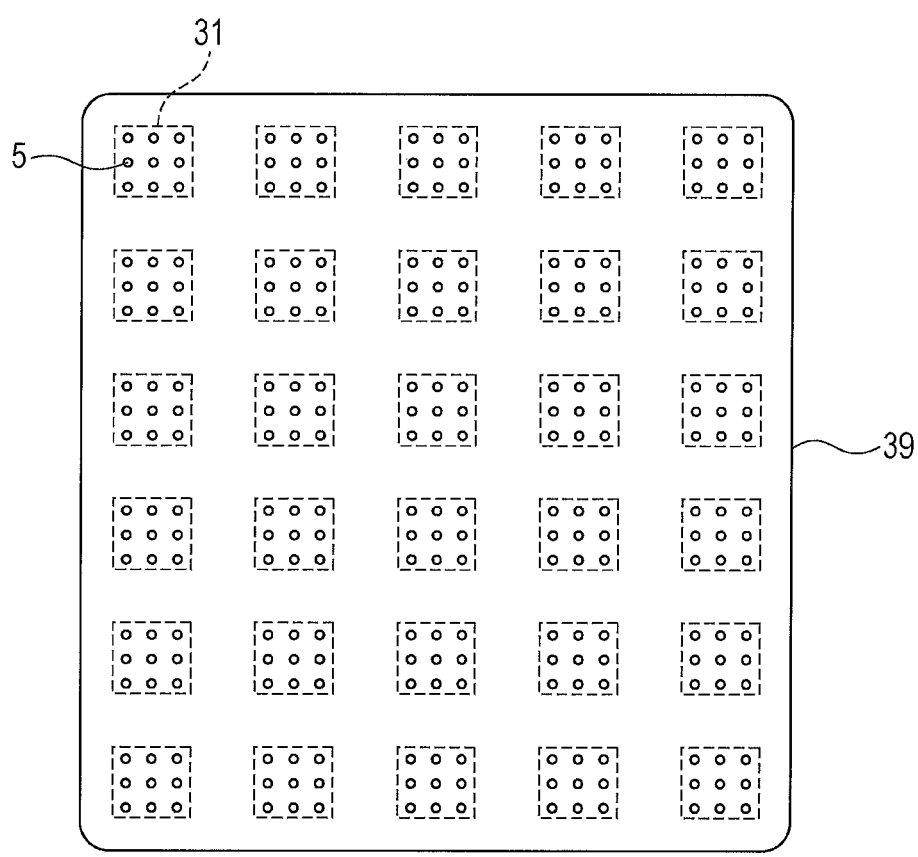
FIG. 9 is a plan view which illustrates a mounting region of the light-emitting device according to Embodiment 3 and a plurality of solder bumps before flattening, which are disposed in the mounting region.

In Embodiment 3, on a bottom surface 39 which has a substantially rectangular shape in top view that is exposed on the wiring substrate 30, a total of 30 light-emitting elements 36 of 5 rows×6 columns are arranged at regular intervals, and these light-emitting elements 36 are connected to the pad portion by the wiring 37. That is, as illustrated in FIG. 9, in the bottom surface 39 (about 7000×7000 μm) surrounded by the frame 34, each of thirty regions surrounded by a broken line in which each light-emitting element is disposed is the mounting region 31. Therefore, in the first process of Embodiment 3, at least nine solder bumps 5 are disposed in each of these mounting regions 31 to be flattened. In Embodiment 3, one of the mounting regions 31 is set to be about 800 μm×800 μm, and the solder bump 5 (about 0.05 g to 0.3 g) of a diameter of about 100 μm to 200 μm, and of a thickness of about 60 μm to 120 μm are disposed at intervals of about 120 μm to 200 μm in the mounting regions 31. A disposition of the solder bump 5 may be individually performed in each mounting region 31; however, it is efficient that the solder bumps are collectively disposed in of a plurality of mounting regions. Then, the top portion of the solder bump is flattened, and a wiring substrate for mounting a light-emitting element with about 270 solder bumps which have flattened top portions is prepared.

Hereinafter, in the same manner as in Embodiment 1, the second process and the third process are performed for the wiring substrate for mounting a light-emitting element, and 30 light-emitting elements 36 and the wiring substrate 30 are bonded. Even in Embodiment 3, the protruding portion 70 may be provided on a side surface of the solder bump in the similar manner as in the first process of Embodiment 2. Subsequently, an electrode of the light-emitting element 36 and the pad portion 33 are electrically connected by wire bonding, and the frame 34 is appropriately filled with a desired light transmitting member 38 to cover the light-emitting element 36 and the wire 37. As necessary, a light transmitting member is cured and individualized by treatment such as heat treatment or light irradiation to complete the light-emitting device 300. In FIG. 8A, frame is illustrated only by outline so that the wiring is visible.

In the light-emitting device 300 of Embodiment 3, an example in which an insulation substrate side of the light-emitting element is mounted (face-up mounting) onto the wiring substrate by the solder bump is illustrated. However, the embodiment is not limited thereto, and the insulation substrate side of the light-emitting element may be flip-chip mounted. That is, a pair of positive and negative wirings which are spaced apart from each other and exposed are provided in a mounting region of each light-emitting element, and the light-emitting element is flip-chip mounted. Flip-chip mounting the light-emitting element in a light-emitting device of a COB structure allows providing a light-emitting device of a small light source with a high output.

In this case, an adhesive (solder) which bonds a pair of positive and negative electrodes of the light-emitting element and a pair of positive and negative wirings, respectively, is formed at intervals between positive and negative so as not to short-cut each other. For example, an interval between solder bumps disposed on adjacent positive and negative wirings can be about 300 μm to 350 μm at a time of disposition. By disposing the solder bumps having such a sufficient interval, the solder bumps disposed on the adjacent positive and negative wirings can be flattened so as not to be joined each other in the first process. Furthermore, the solder bumps can be melted not to be fused in the third process.

As in Embodiment 3, in a light-emitting device in which a plurality of light-emitting elements are mounted onto the wiring substrate, in the case where a solder amount which is used in mounting each light-emitting element can be set to be a small amount, it is possible to significantly reduce material cost of the light-emitting device. Furthermore, since solders of a mounting region of adjacent light-emitting elements are less likely to be in contact, and variation in height of each light-emitting element after a mounting is less likely to occur, so that it is possible to provide a light-emitting device with high reliability.

A manufacturing method of a light-emitting device and a wiring substrate for mounting a light-emitting element of the embodiments of the present invention can be suitably used in manufacturing a light-emitting device which is used in an illumination light source, an LED display, a backlight light source of a liquid crystal display device or the like, a signal, an illuminated switch, various types of sensors, and various types of indicators.

Obviously, numerous modifications and variations of the present invention are possible in light of the above teachings. It is therefore to be understood that within the scope of the appended claims, the invention may be practiced otherwise than as specifically described herein.

What is claimed is:

1. A method of manufacturing a light-emitting device, the method comprising:
   disposing a plurality of solder bumps to a base, the plurality of solder humps each having a bottom portion provided to the base and a top portion opposite to the bottom portion;
   flattening the top portion of each of the plurality of solder bumps;
   disposing a light-emitting element on the top portion of each of the plurality of solder bumps after flattening the top portion; and
   heating the plurality of solder bumps to melt and to fuse so as to connect the light-emitting element to the base,
   wherein the plurality of solder bumps each has a side surface between the bottom portion and the top portion, and
   wherein a protruding portion is provided on the side surface of each of the plurality of the solder bumps when viewing from the top portion to the bottom portion during flattening the top portion.

2. The method according to claim 1, further comprising supplying flux to the top portion, of each of the plurality of solder bumps after flattening the top portion.

3. The method according to claim 1, wherein the protruding portion is provided by joining at least a portion of the plurality of solder bumps during flattening the top portion.

4. The method according to claim 1,
   wherein the base has a wiring, and
   wherein the plurality of solder bumps dispose to the wiring.

5. The method according to claim 1,
   wherein the base has a heat radiation plate, and
   wherein the plurality of solder bumps dispose to the heat radiation plate.

6. The method according to claim 1, wherein the top portion of each of the plurality of solder bumps are flattened so that all of the top portions have substantially the same height.

7. The method according to claim 1, further comprising
   disposing a side wall to the base, and
   wherein the light-emitting element is disposed so that the side wall surrounds the light-emitting element.

8. The method according to claim 1, wherein the base includes a ceramic.

9. The method according to claim 1, wherein the top portion of each of the plurality of solder bumps is flattened by heating.

10. The method according to claim 1, wherein the top portion of each of the plurality of solder humps is flattened by pressurization with jig.

11. The method according to claim 1, wherein pressing the plurality of solder bumps using a mold forms the protruding portion and flattens the top portion of each of the plurality of solder bumps.

12. The method according to claim 4, wherein the wiring includes a pair of positive and negative lead electrodes.

13. The method according to claim 5, wherein the heat radiation plate includes a non-polar plate.

* * * * *